United States Patent [19]

Fujiki

[11] 4,390,513
[45] Jun. 28, 1983

[54] PROCESS FOR MANUFACTURING FIBROUS POTASSIUM TITANATE

[75] Inventor: Yoshinori Fujiki, Sakura, Japan

[73] Assignee: National Institute for Researches in Inorganic Materials, Ibaraki, Japan

[21] Appl. No.: 352,217

[22] Filed: Feb. 25, 1982

[30] Foreign Application Priority Data

Oct. 16, 1981 [JP] Japan ............... 56-165358

[51] Int. Cl.³ .................................. C01G 23/00
[52] U.S. Cl. ............................ 423/598; 156/600; 156/624; 264/63; 264/65
[58] Field of Search ............... 423/598; 156/609, 600, 156/624

[56] References Cited

U.S. PATENT DOCUMENTS

| | | |
|---|---|---|
| 3,952,090 | 4/1976 | Shimizu et al. ............ 423/598 |
| 4,041,143 | 8/1977 | Fujiki et al. ............... 423/598 |
| 4,064,224 | 12/1977 | Kawamata et al. ......... 423/598 |
| 4,179,496 | 12/1979 | Yanagida et al. ........... 423/598 |
| 4,265,872 | 5/1981 | Fujiki ....................... 423/598 |

FOREIGN PATENT DOCUMENTS

| | | | |
|---|---|---|---|
| 55-3370 | 1/1980 | Japan | 423/598 |
| 55-136126 | 10/1980 | Japan | 423/598 |
| 55-136127 | 10/1980 | Japan | 423/598 |
| 56-26719 | 3/1981 | Japan | 423/598 |

*Primary Examiner*—Herbert T. Carter
*Attorney, Agent, or Firm*—Oblon, Fisher, Spivak, McClelland & Maier

[57] ABSTRACT

Fibrous potassium titanate comprises heating to a temperature of 950° C. to 1300° C. potassium titanate of the general formula $K_2O \cdot nTiO_2$ in which n is from 3 to 5, or a mixture of materials from which potassium titanate is formed, to form is manufactured by decomposition a solid phase of potassium hexatitanate and a liquid phase of potassium titanate of the general formula $K_2O \cdot nTiO_2 (2 \leq n \leq 3)$, cooling said potassium hexatitanate and potassium titanate slowly to a temperature of 900° C. to 950° C., and controlling the rate of said cooling to cause a bonding of said potassium hexatitanate and said potassium titanate to form a solid phase of potassium tetratitanate fibers, whereby potassium titanate according to said general formula in which n is from 4 to 6 is caused to grow in single crystal form.

2 Claims, No Drawings

PROCESS FOR MANUFACTURING FIBROUS POTASSIUM TITANATE

BACKGROUND OF THE INVENTION

1. Field of the Invention

This invention relates to a process for manufacturing fibrous potassium titanate, and more particularly, fibrous potassium tetratitanate or hexatitanate, or a mixture thereof.

2. Description of the Prior Art

A number of processes, such as the flux, hydrothermal, fusion or burning process, are known for the manufacture of fibrous potassium titanate. The flux, fusion or burning process is, among others, considered advantageous for the continuous manufacture of fibrous potassium titanate on a large, industrial scale.

All of these processes, however, have their own disadvantages. The flux process is expensive, since it repairs a flux, and the removal and recovery thereof. The fibers obtained by the fusion process are large in diameter and low in strength, and do not lend themselves to utilization for physical purposes, though they may be suitable for chemical purposes. The burning process produces only short fibers, though it is advantageously a simple process.

The inventor of this invention previously conducted research for the manufacture of long potassium titanate fibers by the flux process, and discovered potassium molybdate and potassium tungstate as a novel flux which could be used for manufacturing long potassium titanate fibers without causing any environmental pollution, as disclosed in Japanese Pat. No. 1,034,519. He tried to clarify the mechanism of the flux growth reaction employing the flux which he had discovered. As a result, he discovered the presence of the dissociation and association reactions involving the reaction between a solid phase of titanium oxide and a liquid phase of potassium oxide at a high temperature to form a solid phase of potassium hexatitanate and a liquid phase of potassium oxide, and the slow cooling thereof causing a solid phase of potassium tetratitanate to grow in long fibers, as represented below:

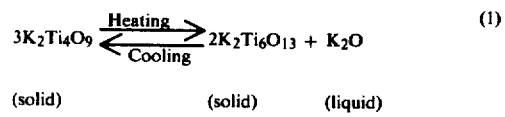

(solid)         (solid)         (liquid)

These reactions were found to require only a small quantity of the flux, since a molten solution of the flux had a catalytic action.

This process has, however, been found to still have the following drawbacks:

(1) The flux is so expensive that even a small quantity thereof adds much to the cost of the materials required by the process;

(2) The equipment required for washing and recovering the flux increases the cost of the facilities required by the process; and (3) A large quantity of industrial water is required for the operation of any such equipment, and increases the cost of production.

SUMMARY OF THE INVENTION

It is an object of this invention to provide a process which can manufacture a large quantity of fibrous potassium titanate at a low cost without using any flux.

The inventors of this invention have been engaged in energetical research for obtaining a simple and inexpensive process for manufacturing fibrous potassium titanate without using any flux. As a result, they have succeeded in exploring a process which can manufacture potassium titanate fibers in accordance with the aforesaid dissociation and association reactions without using any flux.

According to the reactions of equation (1), potassium tetratitanate is dissociated at a high temperature into potassium hexatitanate and liquid potassium oxide, while if they are cooled slowly, they are associated with each other to form potassium tetratitanate. This association by slow cooling causes a high rate of growth of potassium tetratitanate fibers. No flux, or catalyst is required for these reactions. It has, thus, been found possible to obtain potassium titanate fibers without using any flux, or catalyst, if the basic principles of the aforesaid reactions are applied accurately.

It has been found that the following aspects would have an important bearing on the reactions:

(1) Formation of a liquid phase of potassium titanate and a solid phase of potassium hexatitanate by decomposition;

(2) Slow cooling, and its speed;

(3) Decomposition temperature; and (4) Molar ratio of $TiO_2$ and $K_2O$ in the mixture of the starting materials.

When any flux is not used, the starting materials for the general formula $K_2O \cdot nTiO_2 (n=3-5)$ are decomposed at a decomposition temperature of potassium tetratitanate (1114° C.) or higher to form a solid phase of potassium hexatitanate and a liquid phase of potassium titanate ($2 \leq n \leq 3$) and then, they are slowly cooled from the decomposed condition to a temperature in stable of potassium tetratitanate to promote a bonding reaction of the solid phase and the liquid phase whereby fibrous potassium tetratitanate is grown. The composition of the fibers formed by the bonding depends on the decomposition temperature, the slow cooling rate, and the molar ratio of $TiO_2$ and $K_2O$ in the mixture of the starting materials.

In the general formula $K_2O \cdot nTiO_2$, the reactions of equation (1) take place, and if n is 3 for the starting materials the following reactions take place:

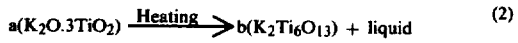

(solid)         (solid)

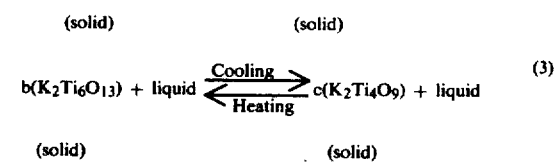

(solid)                    (solid)

(a, b and c respectively represent coefficients which are varied depending upon temperature). (The liquid phase of the general formula $K_2O \cdot nTiO_2$: $2 \leq n \leq 3$).

As is noted, the decomposition and bonding reactions of equation (3) take place, and the potassium hexatitanate phase is predominant at a high temperature, while the potassium tetratitanate phase predominates at a low temperature. The slow cooling procedure promotes the bonding reaction, and thereby, the growth of long potassium tetratitanate fibers.

The product is a fibrous mass and is separated into fibers by dipping the fibrous mass into water for several hours. The liquid phase component which is solidified may be partially dissolved into water to easily result the separation of the fibers. Different types of potassium titanate fibers are obtained depending on the rate of slow cooling to 900° C. even though the reaction product is the some. They are potassium tetratitanate fibers, potassium hexatitanate fibers, or a mixture thereof.

If n is 4 and the starting materials are heated at the decomposition temperature (1114° C.) or higher, the product is decomposed to form a solid phase of potassium hexatitanate and a liquid phase as follows:

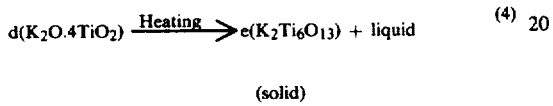

(d and e respectively coefficients). After the decomposition of the equation (4), the decomposition and bonding reactions of the equation (3) are performed.

It is possible to obtain longer potassium titanate fibers if the decomposition and bonding reactions of Equation (3) are repeated using this starting material. It is preferable to subject the decomposition product to slow cooling after it has been left at a decomposition temperature for a certain period of time.

According to this invention, which is based on a lot of findings as hereinabove described, there is, thus, provided a process for manufacturing fibrous potassium titanate, which comprises heating to a temperature of 950° C. to 1300° C. potassium titanate of the general formula $K_2O \cdot nTiO_2$, in which n is from 3 to 5, or a mixture of the starting materials from which potassium titanate is formed, to form a solid of potassium hexatitanate and a liquid phase of potassium titanate, and cooling the decomposition product to a temperature of 900° C. to 950° C. at a controlled rate, whereby decomposition and bonding reactions of equation (3) take place between a solid phase of potassium tetratitanate or hexatitanate and a liquid phase of potassium titanate to thereby forming single crystals of potassium titanate of the above general formula in which n is from 4 to 6.

DETAILED DESCRIPTION OF THE PREFERRED EMBODIMENT

The starting materials may comprise titanium oxide or a compound capable of forming titanium oxide when heated, and potassium oxide or a compound capable of forming potassium oxide when heated, which are mixed in a ratio satisfying the general formula $K_2O \cdot nTiO_2$ in which n is from 3 to 5.

The starting potassium titanate, or a mixture of the starting materials is heated at a temperature of 950° C. to 1300° C., or preferably 1100° C. to 1200° C., for 1 to 10 hours, or preferably 3 to 5 hours, for decomposition into a solid phase of potassium hexatitanate and a liquid phase of potassium titanate ($2 \leq n \leq 3$). The potassium hexatitanate and potassium titanate thus formed are subjected to decomposition and bonding reactions. If the temperature is lower than 950° C., the reaction takes place so slowly that no crystal forms. If the temperature exceeds 1300° C., a waste of heat results, and the apparatus has a shortened life.

The decomposition products are cooled slowly to a temperature of 900° C. to 950° C. after they have been left to stand at the decomposition temperature for 3 to 5 hours. It is possible to obtain longer fibers if the decomposition, holding and slow cooling procedures are repeated. If the decomposition temperature is higher than 1200° C., and if a slow cooling rate higher than 30° C. per hour is employed, it is generally possible to obtain a greater quantity of potassium hexatitanate, depending on the potassium titanate employed, or the molar ratio of $TiO_2$ and $K_2O$ in the mixed starting materials. In the general formula $K_2O \cdot nTiO_2$ for potassium titanate, or the starting materials, it is most preferable that n be 3 or 4. If n is 5, the following decomposition and bonding reactions take place:

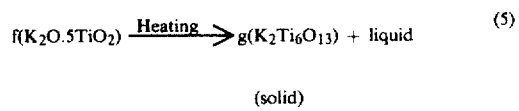

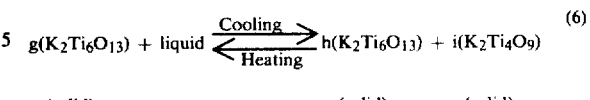

(f, g, h and i respectively designate coefficients). (The liquid phase of the general formula of $K_2O \cdot nTiO_2$; $2 \leq n \leq 3$). There occur an increase in potassium titanate, and a decrease in potassium oxide. As a result, only relatively short fibers are obtained, since there are formed more potassium hexatitanate fibers than potassium tetratitanate fibers which grow more easily.

If n is 6 or above, the decomposition and bonding reactions for forming potassium tetratitanate are not performed since the decomposition melting of potassium tetratitanate and the stable region of potassium tetratitanate are not found on the phase diagram.

In case n is 2, the compound of the above formula has a melting point of 965° C. No decomposition or bonding reaction can take place at any higher temperature, while any temperature lower than the melting point is too low to permit growth of fibers, resulting only in potassium dititanate powder.

The starting potassium titanate may be in the form of amorphous or crystalline powder, or non-fibrous, if it is a compound according to the above general formula in which n is from 3 to 5.

Although titanium oxide is easily available, and preferable, it is also possible to use any other compound that can form titanium oxide by decomposition when it is heated. It is preferable to use amorphous, or anatase type titanium oxide because of its high reactivity with potassium oxide.

Potassium carbonate, bicarbonate, hydroxide or nitrate, or a mixture of two or more such potassium compounds may, for example, be used to form potassium oxide. It is important that a part of the constituents of potassium titanate is formed a liquid phase in the reaction system. It is possible to use any compound if such a liquid phase is formed. The liquid potassium titanate phase may contain some third constituent.

The potassium tetratitanate fibers obtained according to this invention have a special laminar structure. If $K_2O$ is extracted therefrom with warm or boiling water, or an acid, it is possible to obtain potassium hexatitanate fibers which are useful for heat insulating or reinforcing purposes, or titanate fibers which are useful for ion adsorption.

The invention will now be described in further detail with reference to examples.

EXAMPLE 1

Titanium oxide ($TiO_2$) and potassium carbonate ($K_2CO_3$) were mixed in a molar ratio of 3:1. Twenty-five grams of the mixture were placed in a platinum crucible, and heated to 1150° C. in an electric furnace. After the heated material had been held at that temperature to start with fibers composed solely of potassium tetratitanate.

In order to manufacture potassium tetratitanate fibers, it is most suitable to employ a decomposition temperature of 1100° C. to 1150° C., as shown in Table 1. At a temperature of 1200° C., which is higher than the melting point of the material, no decomposition or bonding reaction can take place. The decomposition product must be held at the decomposition temperature for at least four hours. It is preferable to employ a slow cooling rate of 15° C. to 35° C. per hour for satisfactory growth of fibers, though it may be higher than 66° C. per hour.

TABLE 1

| Run No. | Decomposition temp. (°C.) | Holding time (h) | Slow cooling rate (°C./h) | Cooled down to (°C.) | Product | Average fiber length (mm) |
|---|---|---|---|---|---|---|
| 1 | 1,150 | 4 | 8 | 950 | $K_2Ti_4O_9$ | 0.7 |
| 2 | " | " | 16 | " | " | " |
| 3 | " | " | 32 | " | " | " |
| 4 | " | " | 66 | " | " | 0.5 |
| 5 | " | — | 16 | " | " | 0.7 |
| 6 (Comparative) | " | 15 | — | — | $K_2Ti_6O_{13} > K_2Ti_4O_9$ | 0.2 |
| 7 | 1,100 | 4 | 16 | 950 | $K_2Ti_4O_9$ | 0.5 |
| 8 | " | " | 66 | " | " | 0.3 |
| 9 (Comparative) | 1,000 | 15 | — | — | " | 0.1 | ture for four hours, it was cooled to 950° C. slowly at a rate of 16° C. per hour. Then, the crucible taken out of the furnace into the open air, and allowed to cool to ordinary room temperature.

The product is a mass of a mixed phase of fibrous potassium tetratitanate and a solid phase formed from the liquid phase.

The product could easily be removed from the crucible and could be separated in a form of fiber, when they were immersed in cold or warm water for several hours. (The solid phase formed from the liquid phase may be partially dissolved.) Simultaneously, excess potassium, or some of the potassium in the product was removed by dissolution. The product was washed with cold water, subjected to filtration, and dried at 100° C. The X-ray powder diffraction of the dried product indicated that it consisted wholly of potassium tetratitanate. When the product was sintered at 1000° C, fibrous potassium tetratitanate having high crystallinity was formed. The examination by a transmission microscope of a specimen prepared by dispersing the fibers in water indicated an average fiber length of 0.7 mm.

The decomposition temperature, slow cooling rate, and other conditions of manufacture were varied to make various types of products as shown in Table 1.

In order to manufacture potassium hexatitanate or titanic acid fibers on an industrial scale, it is preferable

EXAMPLE 2

Fibrous potassium titanate was obtained by the same procedure as Example 1, except that a mixture of titanium oxide ($TiO_2$) and potassium carbonate ($K_2CO_3$) in a molar ratio of 4:1 was employed. The results obtained are shown in Table 2.

In order to manufacture the fibers of potassium tetratitanate monophase from this starting material, it is necessary to employ a decomposition temperature of 1200° C. to 1300° C., and a slow cooling rate which is lower than 30° per hour. This material is distinctly affected by the decomposition temperature and the slow cooling rate. In the cases of the higher decomposition temperature, the harder mass of fibers is formed. It cannot be separated into fibers unless it is immersed in water for a long time. If the decomposition is carried out at 1150° C., potassium hexatitanate fibers are formed, though slightly, resulting in a mixture of potassium tetratitanate and hexatitanate fibers. These fibers, however, have a greater average length, and are easier to separate than those formed at a decomposition temperature of 1200° C.

TABLE 2

| Run No. | Decomposition temp. (°C.) | Holding time (h) | Slow cooling rate (°C./h) | Cooled down to (°C.) | Product | Average fiber length (mm) |
|---|---|---|---|---|---|---|
| 1 | 1,200 | 4 | 16 | 950 | $K_2Ti_4O_9$ | 0.2 |
| 2 | " | " | 32 | " | " | " |
| 3 | " | " | 66 | " | $K_2Ti_4O_9 >> K_2Ti_6O_{13}$ | 0.1 |
| 4 (Comparative) | " | 15 | — | — | $K_2Ti_6O_{13} >> K_2Ti_4O_9$ | " |
| 5 | 1,150 | 4 | 8 | 950 | $K_2Ti_4O_9 >>> K_2Ti_6O_{13}$ | 0.5 |
| 6 | " | " | 16 | " | " | " |

EXAMPLE 3

Fibrous potassium titanate was obtained by the same procedure as Example 1, except that a mixture of titanium oxide ($TiO_2$) and potassium carbonate ($K_2CO_3$) in a molar ratio of 5:1 was employed. The results obtained are shown in Table 3.

If this material is decomposed at a temperature up to 1300° C., there is formed only a mixture of potassium tetratitanate and hexatitanate fibers. It is possible to convert all of fibrous potassium tetratitanate to fibrous potassium hexatitanate if the mixed fibers are treated by a process for forming potassium hexatitanate fibers from fibers of potassium tetratitanate monophase.

TABLE 3

| Run No. | Decomposition temp. (°C.) | Holding time (h) | Slow cooling rate (°C./h) | Cooled down to (°C.) | Product | Average fiber length (mm) |
|---|---|---|---|---|---|---|
| 1 | 1,300 | 4 | 32 | 950 | $K_2Ti_6O_{13} > K_2Ti_4O_9$ | 0.1 |
| 2 | " | " | 66 | " | " | " |
| 3 | 1,200 | " | 32 | " | " | " |
| 4 | 1,150 | " | 8 | " | $K_2Ti_4O_9 > K_2Ti_6O_{13}$ | 0.2 |

EXAMPLE 4

The steps of heating (decomposition), holding and slow cooling (bonding) of Example 1 were repeated at least twice. The results obtained are shown in Table 4.

A certain increase in fiber length can be achieved by repeating the decomposition and bonding procedures, as is obvious from a comparison between the results of Example 1 shown in Table 1 and those shown in Table 4.

The slow cooling rate has such a bearing on the composition of the product that at a rate of 16° C. per hour, or above, there is formed a mixture of potassium tetratitanate and hexatitanate fibers. It is, therefore, necessary to employ a lower cooling rate in order to manufacture fibers consisting of potassium tetratitanate monophase.

ture of materials from which potassium titanate is formed, to form by decomposition a solid phase of potassium hexatitanate and a liquid phase of potassium titanate of the general formula $K_2O.nTiO_2$ ($2 \leq n \leq 3$), cooling said potassium hexatitanate and potassium titanate slowly to a temperature of 900° C. to 950° C., and controlling the rate of said cooling to cause a bonding of said potassium hexatitanate and said potassium titanate to form a solid phase of potassium tetratitanate fibers, whereby potassium titanate according to said general formula in which n is from 4 to 6 is caused to grow in single crystal form.

2. A process for manufacturing fibrous potassium titanate, which comprises heating to a temperature of 950° C. to 1300° C. potassium titanate of the general formula $K_2O.nTiO_2$ in which n is from 3 to 5, or a mixture of materials from which said potassium titanate is formed, to form by decomposition a solid phase of potassium hexatitanate and a liquid phase of potassium titanate, cooling said potassium hexatitanate and said potassium titanate of the general formula $K_2O.nTiO_2$ ($2 \leq n \leq 3$) slowly to a temperature of 900° C. to 950° C., controlling the rate of said cooling to cause a bonding of said potassium hexatitanate and said potassium titanate to form a solid phase of potassium tetratitanate fibers, and repeating said decomposition and bonding at least

TABLE 4

| Starting material ($K_2O.nTiO_2$) | Decomposition temp. (°C.) | Holding time (h) | Slow cooling rate (°C./h) | Cooled down to (°C.) | Repeated | Product | Average fiber length (mm) |
|---|---|---|---|---|---|---|---|
| $K_2O.3TiO_2$ | 1,150 | 4 | 8 | 950 | Twice | $K_2Ti_4O_9$ | 1.0 |
| " | " | " | 16 | " | " | $K_2Ti_4O_9 >>> K_2Ti_6O_{13}$ | " |
| " | " | " | 32 | " | " | " | " |
| " | " | " | 66 | " | " | $K_2Ti_4O_9 >> K_2Ti_6O_{13}$ | " |

I claim:

1. A process for manufacturing fibrous potassium titanate, which comprises heating to a temperature of 950° C. to 1300° C. potassium titanate of the general formula $K_2O.nTiO_2$ in which n is from 3 to 5, or a mixtwice, whereby potassium titanate according to said general formula in which n is from 4 to 6 is caused to grow in single crystal form.

* * * * *